United States Patent [19]

Tanaka et al.

[11] Patent Number: 5,580,653
[45] Date of Patent: Dec. 3, 1996

[54] HARD COATING HAVING EXCELLENT WEAR RESISTANCE PROPERTIES, AND HARD COATING COATED MEMBER

[75] Inventors: Yusuke Tanaka; Yasuyuki Yamada; Yasushi Onishi, all of Akashi, Japan

[73] Assignee: Kabushiki Kaisha Kobe Seiko Sho, Kobe, Japan

[21] Appl. No.: 432,809

[22] Filed: May 2, 1995

[30] Foreign Application Priority Data

May 13, 1994 [JP] Japan ................................. 6-100154

[51] Int. Cl.$^6$ ............................................. C23C 14/06
[52] U.S. Cl. ......................... 428/336; 407/119; 51/295; 51/307; 51/309; 428/698; 428/699; 106/286.2; 106/286.5; 106/287.11
[58] Field of Search ..................... 425/336, 698, 425/699; 51/295, 307, 309; 407/119; 106/286.2, 286.5, 287.1

[56] References Cited

U.S. PATENT DOCUMENTS

| | | | |
|---|---|---|---|
| 4,447,263 | 5/1984 | Sugizawa et al. | 428/699 |
| 4,469,801 | 9/1984 | Hirai et al. | 428/698 |
| 4,507,189 | 3/1985 | Doi et al. | 427/39 |
| 4,525,415 | 6/1985 | Poral | 428/698 |
| 4,540,596 | 9/1985 | Nimmagadda | 127/37 |
| 4,599,281 | 7/1986 | Schintlmeister et al. | 428/699 |
| 4,714,660 | 12/1987 | Gates, Jr. | 428/699 |
| 4,753,854 | 6/1988 | Gavrilov et al. | 428/698 |

OTHER PUBLICATIONS

Quinto et al "High temperature Microhardness of Hard Coatings Produced by physical and chemical vapor Deposition" Thin Solid Films, 153 (1987) 19–36.

Dasadowski "Electric Properties of Ti–Si–N Thin Cermet Films Deposited in a triode Sputtering System with hot Cathode" Thin Solid Films 162 (1988) 111–117.

*Primary Examiner*—Archene Turner
*Attorney, Agent, or Firm*—Oblon, Spivak, McClelland, Maier, & Neustadt, P.C.

[57] ABSTRACT

A hard coating of general formula (Al,Ti,Si)N or (Al,Ti,Si)(C,N) exhibiting excellent wear resistance and oxidation resistance properties, and a coated member such as a cutting tool etc. comprising a substrate and the hard coating formed on the surface of the substrate.

5 Claims, 1 Drawing Sheet

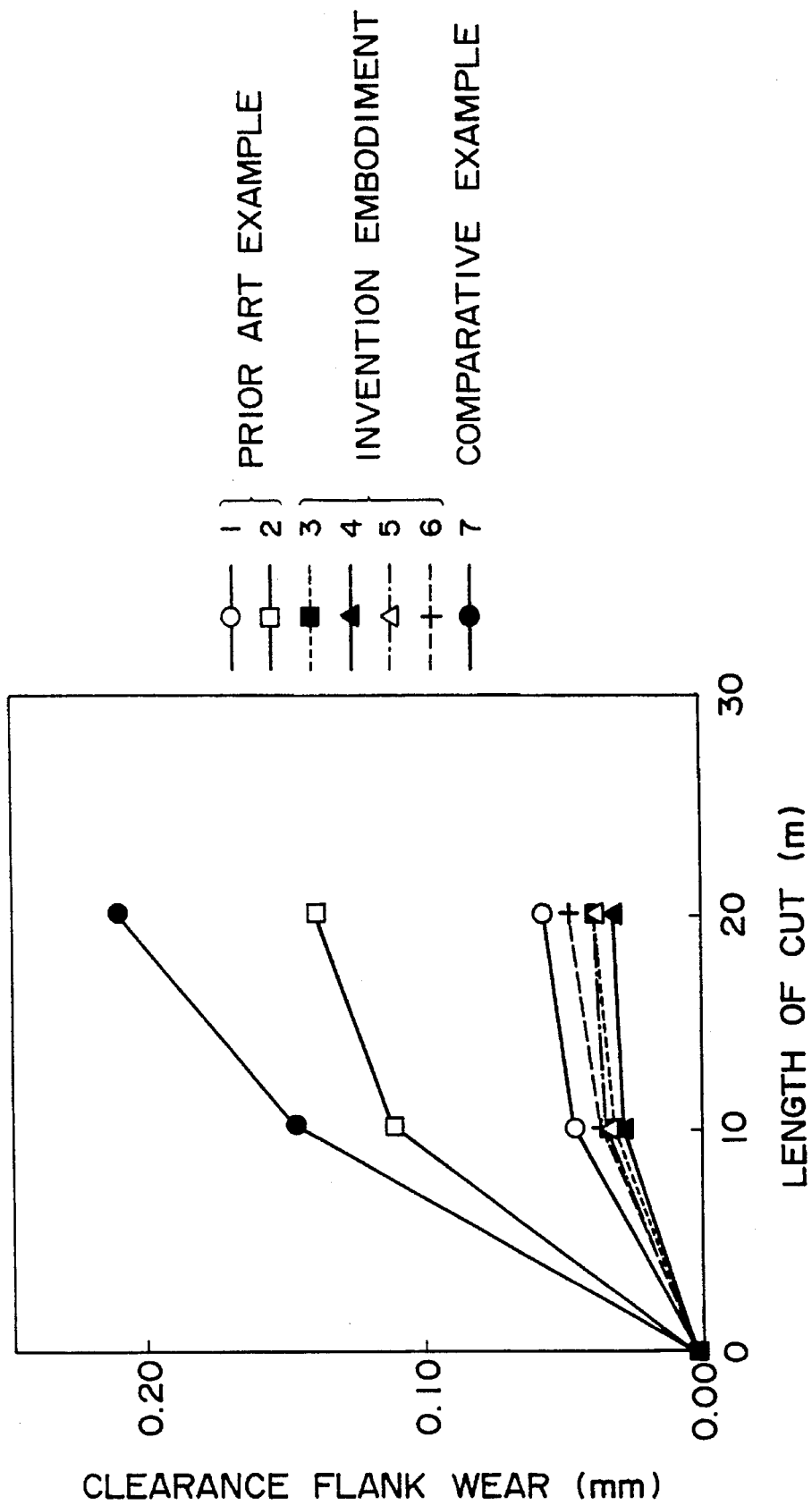

HARD COATING HAVING EXCELLENT WEAR RESISTANCE PROPERTIES, AND HARD COATING COATED MEMBER

FIELD OF THE INVENTION

The present invention relates to a hard coating suitable for use as a surface coating for a wear resistant member for which a high level of hardness is demanded such as cutting tools employed in milling, cutting, boring operations etc., moulds, bearings, dice, rollers etc.; or for use as a surface coating for a heat-corrosion resistant member such as the screw of an extruder, cylinders etc., and also to the coated member exhibiting excellent wear resistance through the application of such a hard coating thereon.

DESCRIPTION OF THE RELATED ART

The formation of a hard coating such as TiN, TiC etc. on the surface of a tool in order to improve the wear resistant properties of the tool is a technique commonly used in the field of cutting tools for which a high wear resistance is demanded such as high speed steel tools, carbide tools etc.

Compared to TiC coatings, TiN coatings display improved oxidation resistance at high temperatures, and also display improved resistance to crater wear on the rake face of the tool caused by frictional or working heat generated during cutting. TiN is also preferred for it's excellent adhesive properties. On the other hand, TiC is harder than TiN, and also displays better wear resistance to "flank wear" on the flank face which contacts the workpiece. However, even TiN begins to oxidise at the relatively low temperature of 600° C., and TiC has a Vickers hardness no greater than 2000 kgf/mm$^2$, and thus there was a demand for a new coating of improved wear resistance.

In Japanese Patent Publication No. 2-194159, a new coating developed to meet these demands for a coating having improved hardness and oxidation resistance properties compared to TiN, TiC etc. is disclosed. This new coating is formed from a Ti, Al mixed nitride or Ti, At mixed carbo-nitride [(Al,Ti)(N,C)], in which some of the titanium has been exchanged for aluminum. These coatings have an oxidation temperature of about 800° C. and a Vickers hardness of 500 kgf/mm$^2$.

However, in the field of cutting tools for example there is still a demand for a hard coating having further improved wear resistance properties.

SUMMARY OF THE INVENTION

This invention was made in light of the above-described problems in the prior art, and has as its objective the provision of a hard coating having improved hardness, wear resistance, and oxidation resistance properties compared to (Al,Ti)(C,N) coatings, without losing the excellent level of substrate-coating adhesion exhibited by TiN coatings.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein FIG. 1 provides a graph of the degree of wear on the flank face for various coating compositions at different cut lengths.

The hard coating according to the present invention has the following composition;

$$(Al_xTi_{1-x-y}Si_y)(N_zC_{1-z}),$$

where
 $0.05 \leq x \leq 0.75$,
 $0.01 \leq y \leq 0.1$, and
 $0.6 \leq z \leq 1$.

It is preferred that the thickness of the coating be in the range of 0.1–20 μm.

It is possible to obtain a coated member having excellent wear resistance properties if the above hard coating is formed on the surface of a substrate using an arc discharge ion-plating method.

The hard coating having the above composition exhibits (i) excellent hardness, (ii) excellent resistance to oxidation, and (iii) excellent wear resistance.

Furthermore, the excellent substrate-coating adhesion exhibited by TiN coatings is not lost, which means that the hard coating can be applied to the surface of a cutting tool, mould or other member in which wear resistance is demanded, to obtain a coated member for which them is no problems of peeling, and in which the excellent wear resistance of the hard coating can be amply exploited.

The mason for the improvement in wear resistance properties of this invention over the prior art is not yet fully understood, but it is suggested that the inclusion of a third metal component, Si, (i) serves to prevent the oxidation of Ti at high temperatures, and also (ii) significantly densify or strengthen a "protective" layer comprising aluminim oxide.

It is essential that the metal components of the hard coating of this invention have a composition given by the following expression; $(Al_xTi_{1-x-y}Si_y)$ where $0.05 \leq x \leq 0.75$, and $0.01 \leq y \leq 0.1$. If x is less than 0.05, or y is less than 0.01, then it is impossible to realise to a sufficient extent the improvement in the oxidation resistance properties. Also, if x exceeds 0.75, or y exceeds 0.1, the crystal structure of the coating changes from a cubic structure to a hexagonal structure, with a consequent decrease in the hardness and wear resistance properties.

It is preferred that the value of x be in the range 0.25 to 0.75, and more preferably in the range 0.56 to 0.7. With respect to the value of y, it is preferred that it be in the range 0.01 to 0.08 and more preferably in the range 0.02 to 0.05.

According to this invention, it is possible to obtain a coating displaying excellent wear resistance properties whether the hard coating be a mixed metal nitride, or a mixed metal carbide-nitride. However, in the case of a carbide-nitride, it is essential that the nitrogen be present in an atomic ratio of 60% or more. In other words, if the composition of the non-metallic components of the carbide-nitride coating composition be expressed by $(N_zC_{1-z})$, it is essential that $0.6 \leq z \leq 1$. If z is less than. 0.6, the oxidation resistance properties of the coating are reduced. If z is equal to or greater than 0.8, then the oxidation resistance properties are further improved.

The thickness of the coating is preferably in the range of 0.1 to 20 μm. If the thickness is less than 0.1 μm, the wear resistance of the coating is not sufficient; and if the thickness exceeds 20 μm, undesirable cracks sometimes appear in the coating caused by impact forces. In the case that this invention is applied to a cutting tool, then in order to obtain a coated tool having excellent wear resistance, whilst exploiting the inherent cutting properties of the substrate tool, it is preferable that the thickness be equal to or greater than 1 μm, and more preferably equal to or greater than 2 μm. With respect to the upper limit of the thickness, it is preferable that the thickness be equal to or less than 12 μm, and more preferably equal to or less than 8 μm.

The material to be used as the substrate in the coated member according to this invention is not particularly limited, but hard materials such as high speed tool steels, carbides, die steels, cermet, ceramics etc. are suitable for exploiting the excellent wear resistance of the coating, and for obtaining a high level of adhesion between the substrate and coating.

A PVD method typified by ion plating methods, sputtering methods etc. can be used to form the hard coating of this invention on a substrate. In the case that an arc discharge type method is employed, it is preferred that an ion-plating method in which the metal components Al, Ti and Si ionized from the cathode-vaporization source in an atmosphere of nitrogen gas and/or methane gas is used. If a target having the same composition as that desired for the hard coating is used, a hard coating of a consistent composition can easily be obtained. Also, if a bias voltage is applied to the substrate, the adhesion of the coating to the subswam can be further enhanced. It is also preferred that the pressure of the gas used in the ion-plating technique be in the range of $1 \times 10^{-3}$ to $5 \times 10^{-2}$ Torr, in order to make it easier to obtain a dense and highly crystalline hard coating having excellent wear resistance.

Next, examples of the present invention will be described. The following examples are given to aid in understanding the invention and it is to be understood that the invention is not limited to the particular materials, procedures, or conditions given in the examples.

DESCRIPTION OF EXAMPLES OF THE INVENTION

EXAMPLE 1

A substrate made from platinum foil and having dimensions, 7 mm×25 mm, length 25 mm, is mounted in an arc discharge ion-plating apparatus and heated to 400° C. The chamber of the apparatus is evacuated, and then metal elements are vaporised from a cathode having various compositions as shown in Table 1 below, whilst supplying the reactive gas, i.e. nitrogen gas or nitrogen/methane gas mixture, to the chamber to a pressure of $7 \times 10^{-3}$ Torr, and applying a bias voltage of −150 V to the substrate. By this method, coatings of thickness 5 μm and having compositions detailed in Table 1 below are formed on the substrate to produce test pieces.

The composition of the coating of each test piece was determined by electron probe X-ray microanalysis and Auger electron spectroscopy. The test pieces were then subjected to an oxidation test under the following conditions;

Temperature Range: Room Temperature-1300° C.
Rate of Temperature Increase: 10° C./min
Atmosphere: Dry Air, 1 atm.
flow Rate of Air: 150 cm$^3$/min

TABLE 1

| No. | Cathode Material | Reactive Gas | Coating Composition | Oxidation Temperature (C.) | Hardness (HV) | |
|---|---|---|---|---|---|---|
| 1 | $Al_{0.6}Ti_{0.4}$ | $N_2$ | $(Al_{0.6}Ti_{0.4})N$ | 820 | 2720 | Prior Art Ex. |
| 2 | $Al_{0.69}Ti_{0.30}Si_{0.005}$ | $N_2$ | $(Al_{0.7}Ti_{0.29}Si_{0.007})N$ | 820 | 2480 | Prior Art Ex. |
| 3 | $Al_{0.59}Ti_{0.4}Si_{0.01}$ | $N_2$ | $(Al_{0.6}Ti_{0.39}Si_{0.01})N$ | 910 | 3040 | Invention Ex. |
| 4 | $Al_{0.59}Ti_{0.4}Si_{0.01}$ | $N_2/CH_4$ | $(Al_{0.6}Ti_{0.39}Si_{0.01})(N_{0.8}C_{0.2})$ | 870 | 3180 | Invention Ex. |
| 5 | $Al_{0.57}Ti_{0.38}Si_{0.05}$ | $N_2$ | $(Al_{0.57}Ti_{0.38}Si_{0.05})N$ | 1020 | 2950 | Invention Ex. |
| 6 | $Al_{0.57}Ti_{0.38}Si_{0.05}$ | $N_2/CH_4$ | $(Al_{0.57}Ti_{0.38}Si_{0.05})(N_{0.9}C_{0.1})$ | 950 | 3060 | Invention Ex. |
| 7 | $Al_{0.54}Ti_{0.36}Si_{0.1}$ | $N_2$ | $(Al_{0.54}Ti_{0.36}Si_{0.1})N$ | 1100 | 2750 | Invention Ex. |
| 8 | $Al_{0.48}Ti_{0.32}Si_{0.2}$ | $N_2$ | $(Al_{0.5}Ti_{0.3}Si_{0.2})N$ | 1120 | 1900 | Comp. Ex. |

As is clear from Table 1, in contrast to the prior art example, No. 1, which begins to oxidise at a temperature of 820° C., the embodiments according to this invention, Nos. 3–7, all have oxidation temperatures greater than 870° C., indicating an improvement in the oxidation resistance properties. Comparative Example No. 2 in which the amount of included Si is reduced, begins to oxidise at a relatively low temperature, indicating no improvement in the oxidation resistance properties.

EXAMPLE 2

Test pieces are manufactured by forming on a WC-Co carbide chip substrate, a coating of thickness 10 μm, according to the same method as described in Example 1. The Vickers hardness at a load of 100 g, was then measured for each piece, and the results are shown in Table 1.

As can be seen from Table 1, the embodiments according to this invention (Nos. 3–7) all have increased hardness values compared to the prior art (Al,Ti)N example, No. 1.

Comparative Example No.8, in which the amount of included silicon is too large, has a hardness value significantly reduced as a result of the change in crystal structure from a cubic structure to a hexagonal structure.

EXAMPLE 3

A hard coating of various compositions, as detailed in Table 2, and of thickness 4 μm is formed on the surface of the cutting edges of a twin-blade endmill of external diameter, 10 mm made from a carbide. A crucible-type vapour-deposition method is used to form the coating of test piece No.2, and an arc discharge ion-plating method is used to form the coating of all the other test pieces. Those coatings formed using the arc-discharge ion-plating method were formed under the following conditions; substrate temperature, 400° C.; bias voltage, −150 V; reactive gas pressure, $7 \times 10^{-3}$ Torr.

The thus obtained endmills were then subject to a cutting test under the conditions detailed below, and the degree of wear on the flank face of the endmill cutting edge was measured. The results are shown in table 2.

Cutting Conditions:
Cutting Method: Down Cut
Work Material: SKDI 1 (Brinell Hardness HB 219)
Depth of Cut: Rd 1 mm×Ad 10 mm
Cutting Speed: 60 m/min
Feed: 0.07 mm/tooth (270 mm/min)
Lubricant: Air Blow
Length of Cut: 20 m The thus obtained drills were then subject to a cutting test under the below conditions in order to determine the working life of each drill. The results are shown in Table 3.

Cutting Conditions

Cutting Method: Drilling, five drills

Work Material: S55C (Brinell Hardness HB 220)

Cutting Speed: 30 m/mm

Feed: 0.15 mm/rev

Hole Length: 30 mm

Lubricant: Water-soluble emulsion type cutting lubricant

TABLE 2

| No. | Coating Formation Method | Coating Composition | Clearance Face Wear (mm) | |
|---|---|---|---|---|
| 1 | Arc Discharge Ion Plating | $(Al_{0.6}Ti_{0.4})N$ | 0.056 | Prior Art Example |
| 2 | Crucible Vapor Deposition IP | $Ti(N_{0.7}C_{0.2})$ | 0.140 | Prior Art Example |
| 3 | Arc Discharge Ion Plating | $(Al_{0.6}Ti_{0.39}Si_{0.01})N$ | 0.038 | Invention Example |
| 4 | Arc Discharge Ion Plating | $(Al_{0.58}Ti_{0.39}Si_{0.03})N$ | 0.032 | Invention Example |
| 5 | Arc Discharge Ion Plating | $(Al_{0.57}Ti_{0.38}Si_{0.05})N$ | 0.039 | Invention Example |
| 6 | Arc Discharge Ion Plating | $(Al_{0.54}Ti_{0.36}Si_{0.1})N$ | 0.047 | Invention Example |
| 7 | Arc Discharge Ion Plating | $(Al_{0.5}Ti_{0.3}Si_{0.2})N$ | 0.210 | Comparative Example |

As is clear from the results shown in Table 2 and FIG. 1, the endmills (Nos.3–6) to which this invention was applied, are subject to less wear on the flank face compared to the prior art examples (Nos. 1,2) indicating improved resistance to flank wear. Comparative Example No.7 in which the amount of included Si is too large, is subject to severe wear on the clearance face indicating poor wear resistance.

EXAMPLE 4

A drill (JIS standard SHK55) of 10 mm diameter is made from a high speed tool steel. A hard coating of various compositions, as detailed in Table 3, were then formed on the surface of the cutting edge of the drill using the same formation method described in Example 3.

TABLE 3

| No. | Formation Method | Coating Composition | No. Holes Drilled | |
|---|---|---|---|---|
| 1 | Arc Discharge Ion Plating | $(Al_{0.6}Ti_{0.4})N$ | 638 | Prior Art Example |
| 2 | Crucible Vapor Deposition IP | $Ti(N_{0.8}C_{0.2})$ | 322 | Prior Art Example |
| 3 | Arc Discharge Ion Plating | $(Al_{0.6}Ti_{0.39}Si_{0.01})N$ | 755 | Invention Example |
| 4 | Arch Discharge Ion Plating | $(Al_{0.58}Ti_{0.39}Si_{0.03})N$ | 988 | Invention Example |
| 5 | Arc Discharge Ion Plating | $(Al_{0.57}Ti_{0.38}Si_{0.05})N$ | 866 | Invention Example |
| 6 | Arc Discharge Ion Plating | $(Al_{0.54}Ti_{0.36}Si_{0.1})N$ | 792 | Invention Example |
| 7 | Arc Discharge Ion Plating | $(Al_{0.5}Ti_{0.3}Si_{0.2})N$ | 180 | Comparative Ex. |

As is clear from the results shown in Table 3, the drills to which the present invention has been applied (Nos.3–6) can be used to drill far more holes than the prior art examples (Nos. 1 and 2), i.e. the working life of the drills according to the present invention is lengthened. Comparative Example No.7, in which the amount of included silicon is too large, has a short working life manifested by the reduced number of drilled holes.

EXAMPLE 5

A mould (JIS standard SKD61) of dimensions 40 mm×20 mm×5 mm is manufactured, and a coating of thickness 5 μm and of various compositions, as detailed in Table 4, is formed on the mould using the same method described in Example 1. The coated moulds thus obtained are subject to heat cycle test under the conditions below in order to determine their durability. The results are shown in Table 4.

Heat Cycle Test Conditions:
High Temperature Bath: 800° C. Duration: 110 seconds
Low Temperature Bath: Water-cooled Duration: 10 seconds

TABLE 4

| No. | Coating Composition | No. heat cycles until crack generation | |
|---|---|---|---|
| 1 | TiN | 150 | Prior Art Example |
| 2 | $(Al_{0.5}Ti_{0.5})N$ | 635 | Prior Art Example |
| 3 | $(Al_{0.58}Ti_{0.39}Si_{0.03})N$ | 960 | Inventive Example |

As is clear from the results shown in table 4, the mould to which the present invention has been applied (No 3) displays improved durability compared to the prior art examples (Nos. 1 and 2).

What is claimed is:

1. A hard coating having a composition given by the following formula:

$$(Al_xTi_{1-x-y}Si_y)(N_zC_{1-z}),$$

where
$0.05 \leq x \leq 0.75$,
$0.01 \leq y \leq 0.1$, and
$0.6 \leq z \leq 1$.

2. The hard coating according to claim 1 having a thickness in the range 0.1–20 μm.

3. A coated member comprising a substrate and a coating as claimed in claims 1 or 2 formed on the surface of said substrate.

4. A coated member according to claim 3 wherein said coated member is a cutting tool.

5. The coated member according to claim 3 wherein said coating is formed on the surface of said substrate using an arc discharge ion-plating method.

* * * * *